United States Patent [19]

Makino

[11] Patent Number: 5,438,544
[45] Date of Patent: Aug. 1, 1995

[54] NON-VOLATILE SEMICONDUCTOR MEMORY DEVICE WITH FUNCTION OF BRINGING MEMORY CELL TRANSISTORS TO OVERERASED STATE, AND METHOD OF WRITING DATA IN THE DEVICE

[75] Inventor: Takami Makino, Kawasaki, Japan

[73] Assignee: Fujitsu Limited, Kawasaki, Japan

[21] Appl. No.: 187,541

[22] Filed: Jan. 28, 1994

[30] Foreign Application Priority Data

Mar. 19, 1993 [JP] Japan .................................. 5-059857

[51] Int. Cl.⁶ .............................................. G11C 7/00
[52] U.S. Cl. .................................. 365/185; 365/218; 365/900
[58] Field of Search ................. 365/218, 900, 185, 210

[56] References Cited

U.S. PATENT DOCUMENTS 5,270,979 12/1993 Harari et al. ..................... 365/189.01
5,295,107 3/1994 Okazawa et al. ..................... 365/218

OTHER PUBLICATIONS

IEEE Journal of Solid-State Circuits, vol. 24, No. 5, Oct. 198, pp. 1259-1264 "A 90-ns One-Million Erase/-Program Cycle 1-Mbit Flash Memory".

Primary Examiner—Joseph A. Popek
Assistant Examiner—Son Dinh
Attorney, Agent, or Firm—Nikaido, Marmelstein, Murray & Oram

[57] ABSTRACT

A non-volatile semiconductor memory device includes a control circuit provided for controlling erasure and writing of data with respect to memory cell transistors. In an erase operation, the control circuit generates a voltage which is required for bringing memory cell transistors to an overerased state. In a write operation, the control circuit sets respective voltages of each control gate of memory cell transistors to be an identical one, and generates a first voltage required for releasing memory cell transistors in an overerased state from the overerased state to thereby cause the memory cell transistors to present a first logic level. A second voltage is generated which is required for releasing memory cell transistors in an overerased state from the overerased state to thereby cause the memory cell transistors to present a second logic level. The control circuit further brings all of memory cell transistors included in a minimal block portion which is an object of erasure to an overerased state, by means of a flash erasure. It is therefore possible to realize a high speed erase operation and a high speed write operation.

6 Claims, 7 Drawing Sheets

Fig.6

|  | CHANNEL ERASURE | | SOURCE ERASURE | | WRITE | | VERIFY | |
| --- | --- | --- | --- | --- | --- | --- | --- | --- |
|  | SELECT | NON-SELECT | SELECT | NON-SELECT | SELECT | NON-SELECT | SELECT | NON-SELECT |
| WL1 | -10V | 0~5V | -10V | 0V | 20V | 0~10V | 5V | 0V |
| WL2 | -10V | 0~5V | -10V | 0V | 0~10V | 0~10V | 0V | 0V |
| SG1 | 0V | 0V | 0V | 0V | 5V | 0V | 5V | 0V |
| BL1 | 0V | 0V | 0V | 0V | 5V | 5V | 1V | 5V |
| BL2 | 0V | 0V | 0V | 0V | 0V | 0V | 0V | 0V |
| SG2 | 0V | 0V | 5V | 0V | 0V | 0V | 5V | 0V |
| SL | 0V | 0V | 5V | 0V | 0V | 0V | 0V | 0V |
| P-TYPE WELL | 5V | 5V | 0V | 0V | 0V | 0V | 0V | 0V | de # NON-VOLATILE SEMICONDUCTOR MEMORY DEVICE WITH FUNCTION OF BRINGING MEMORY CELL TRANSISTORS TO OVERERASED STATE, AND METHOD OF WRITING DATA IN THE DEVICE

BACKGROUND OF THE INVENTION

1. Field of the Invention

The present invention relates to a non-volatile semiconductor memory device. More particularly, it relates to a non-volatile semiconductor memory device such as an EEPROM (electrically erasable and programmable ROM), flash memory, or the like, in which each transistor having a two-layer gate structure with a control gate and a floating gate is constituted as a memory cell transistor, and to a method of writing data in the device.

2. Description of the Related Art

As a non-volatile semiconductor memory device of the above type, a flash memory is known. In a typical flash memory, a write processing is carried out by first executing an erase operation with respect to an object block of erasure and then executing a write operation.

In the erase operation, a write processing is carried out for a specific reason, prior to the erase processing, with respect to all of memory cell transistors in the object block of erasure. Also, after the erase processing, a verify processing is carried out for a specific reason, with respect to all of the memory cell transistors included in the object block of erasure.

Namely, the prior art flash memory has required the writing into all of the memory cell transistors in the object block of erasure before the erasure, and has required the verify processing after the erasure. As a result, a problem has been posed in that time required for the entire erase and write operation is relatively prolonged.

Note, the problem in the prior art will be explained later in detail in contrast with the preferred embodiments of the present invention.

SUMMARY OF THE INVENTION

An object of the present invention is to provide a non-volatile semiconductor memory device, and a data writing method, which can realize a high speed erase operation and a high speed write operation.

According to a first aspect of the present invention, there is provided a non-volatile semiconductor memory device wherein each transistor having a two-layer gate structure with a control gate and a floating gate is constituted as a memory cell transistor, the non-volatile semiconductor memory device including a control circuit provided for controlling erasure and writing of data with respect to memory cell transistors, the control circuit generating, in an erase operation, a voltage required for bringing memory cell transistors to an overerased state, and in a write operation, the control circuit setting respective voltages of each control gate of memory cell transistors to be an identical one, and generating a first voltage required for releasing memory cell transistors in an overerased state from the overerased state to thereby cause the memory cell transistors to present a first logic level, and a second voltage required for releasing memory cell transistors in an overerased state from the overerased state to thereby cause the memory cell transistors to present a second logic level, the control circuit bringing all of memory cell transistors included in a minimal block portion which is an object of erasure, to an overerased state, by means of a flash erasure.

Also, according to a second aspect of the present invention, there is provided a non-volatile semiconductor memory device wherein each transistor having a two-layer gate structure with a control gate and a floating gate is constituted as a memory cell transistor, the non-volatile semiconductor memory device including: a control circuit provided for controlling erasure and writing of data with respect to memory cell transistors, the control circuit generating, in an erase operation, a voltage required for bringing memory cell transistors to an overerased state, and in a write operation, the control circuit setting respective voltages of each control gate of memory cell transistors to be an identical one, and generating a first voltage required for releasing memory cell transistors in an overerased state from the overerased state to thereby cause the memory cell transistors to present a first logic level, and a second voltage required for releasing memory cell transistors in an overerased state from the overerased state to thereby cause the memory cell transistors to present a second logic level; and a verify/monitor circuit block provided for a minimal block portion which is an object of a flash erasure, the verify/monitor circuit block including at least one verify/monitor memory cell transistor, the control circuit reading data of the at least one verify/monitor memory cell transistor to which overerasure or writing is carried out simultaneously with regular memory cell transistors included in the minimal block portion, and thus sensing respective states of erasure or writing of the regular memory cell transistors.

Furthermore, according to a third aspect of the present invention, there is provided a method of writing data in a non-volatile semiconductor memory device wherein each transistor having a two-layer gate structure with a control gate and a floating gate is constituted as a memory cell transistor, the method including the steps of: executing a flash erasure with respect to all of memory cell transistors included in a minimal block portion which is an object of erasure, to thereby bring all of the memory cell transistors to an overerased state; simultaneously writing "0" data or "1" data, with units of a plurality of memory cell transistors connected to an identical word line in the object block of erasure; and judging whether or not memory cell transistors with insufficient writing of "1" data are present among the plurality of memory cell transistors, and where the judging indicates YES, executing the step of simultaneously writing "0" data or "1" data.

BRIEF DESCRIPTION OF THE DRAWINGS

Other objects and features of the present invention will be described hereinafter in detail by way of preferred embodiments with reference to the accompanying drawings, in which:

FIG. 6 is a diagram showing the relationship between potentials of each signal line in the circuit shown in FIG. 5;

DESCRIPTION OF THE PREFERRED EMBODIMENTS

Throughout the description, identical references used in connection with the drawings indicate like constituent elements, and thus the repetition of explanation thereof is omitted.

First, for a better understanding of the preferred embodiment of the present invention, the related prior art will be explained with reference to FIGS. 1 to 3.

Figure 1:
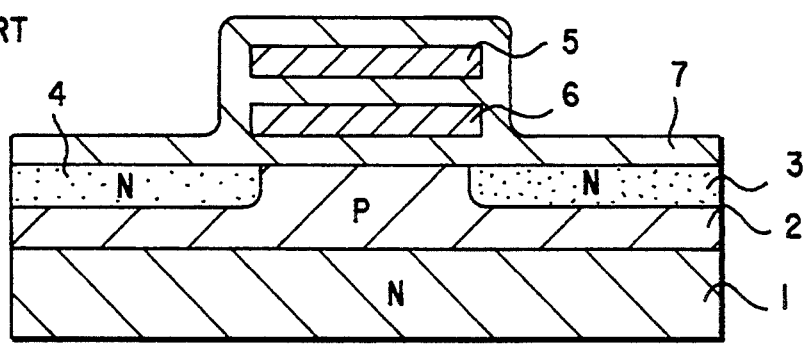
FIG. 1 is a sectional view schematically showing the structure of a typical memory cell transistor provided in a flash memory.

FIG. 1 schematically shows the structure of a memory cell transistor provided in a flash memory.

In the illustration, reference 1 denotes an N-type silicon substrate; reference 2 a P-type well formed on the substrate 1; reference 3 an N-type diffusion layer constituting a drain (region); reference 4 an N-type diffusion layer constituting a source (region); reference 5 a control gate; reference 6 a floating gate; and reference 7 an insulation layer.

In general, "writing" means a processing of injecting electrons into the floating gate 6 of the memory cell transistor and, in a read operation, bringing the memory cell transistor to an OFF state. Such a state is reckoned as, for example, a "0" stored state.

Also, "erasure" means a processing of drawing out electrons injected into the floating gate 6 of the memory cell transistor and, in a read operation, bringing the memory cell transistor to an ON state. Such a state is reckoned as, for example, a "1" stored state.

Conventionally, a write processing has been carried out, for example, by selecting potentials of the control gate 5, the source 4, and the drain 3, to be 12 V, 0 V, and 5 V, respectively; causing an avalanche breakdown phenomenon in the vicinity of the drain 3 to thereby generate electrons (i.e., hot carriers); and injecting the generated electrons into the floating gate 6.

On the other hand, an erase processing has been carried out, for example, by selecting potentials of the control gate 5 and the source 4, to be 5 V and 12 V, respectively; bringing the drain 3 to an open state; and utilizing a tunnel effect to thereby draw out electrons injected into the floating gate 6, toward the source 4. Such a processing is generally referred to as a "source" erasure.

Alternatively, another erase processing has been carried out by selecting potentials of the control gate 5 and the P-type well 2, to be 0 V and 12 V, respectively; bringing the source 4 and the drain 3 to an open state, respectively; and utilizing a tunnel effect to thereby draw out electrons injected into the floating gate 6, toward the P-type well 2. Such a processing is generally referred to as a "channel" erasure.

Figure 2:
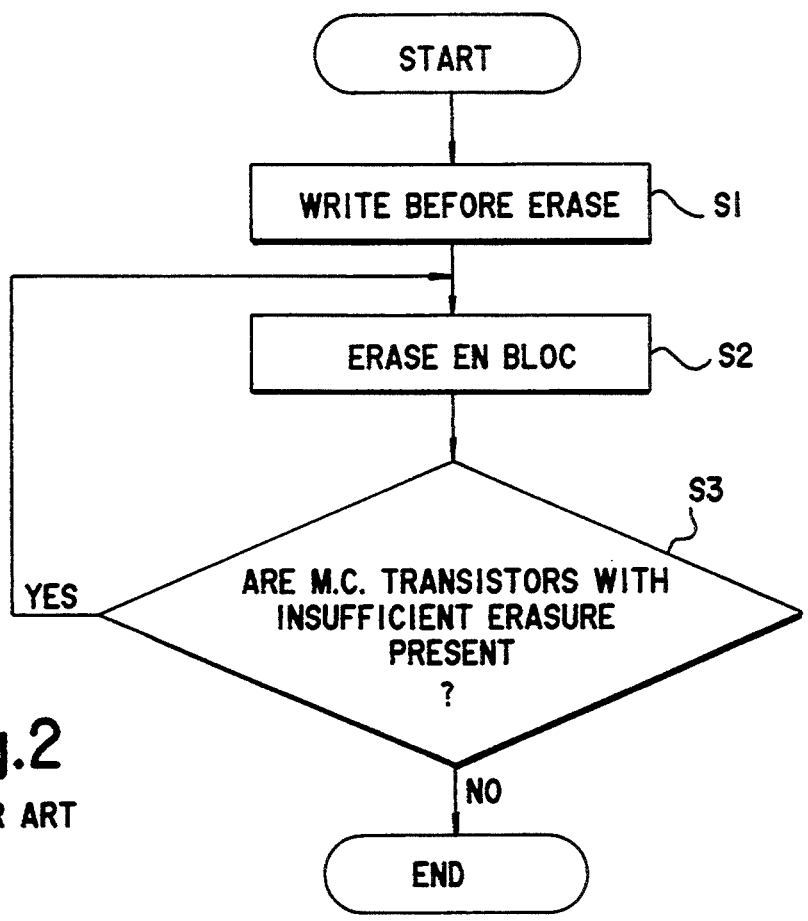
FIG. 2 is a flowchart representing the sequence of an erase processing executed in a prior art flash memory.
Figure 3:
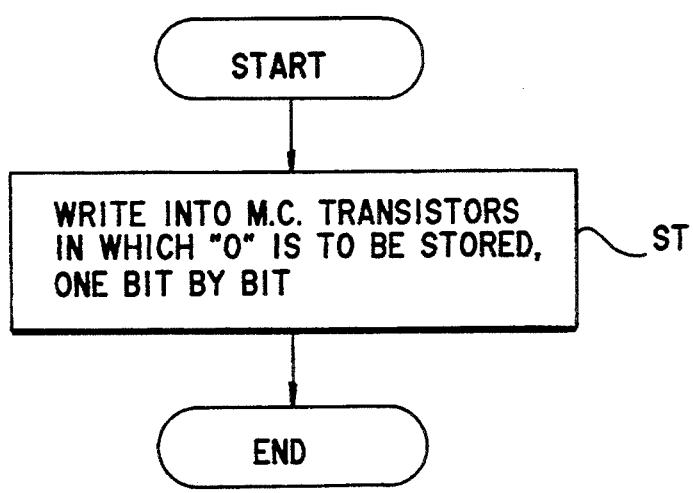
FIG. 3 is a flowchart representing the sequence of a write processing executed in a prior art flash memory.

Since a prior art flash memory has been constituted so as to carry out the above erase and write processings, a data-writing has been carried out by first executing an erase processing sequence shown in FIG. 2 and then executing a write processing sequence shown in FIG. 3.

Referring to FIG. 2, a writing is first carried out with respect to all of memory cell transistors included in a block which is an object of erasure ("WRITE BEFORE ERASE" processing at step S1), and an erasure is then carried out with respect to all of the memory cell transistors in the object block ("ERASE EN BLOC" processing at step S2). Hereinafter, the manner of erasing en bloc is referred to as "flash erasure", for convenience. At the next step S3, a judgment whether memory cell transistors with insufficient erasure are present (YES) or not (NO) is carried out. Where the judgment indicates YES, the control returns to step S2, and where the judgment indicates NO, the control comes to an END. Namely, a verify processing is carried out, one bit by bit, with respect to all of the memory cell transistors in the object block. Thus, a flash erasure operation is repeated until the erasure is completed with respect to all of the memory cell transistors in the object block.

Next, referring to FIG. 3, a writing is carried out, one bit by bit, with respect to memory cell transistors in which "0" is to be stored, among all of the memory cell transistors in the object block of erasure.

Note, in the erase processing sequence, it is for the reason of making uniform respective threshold levels of the memory cell transistors before erasure and thus making uniform respective threshold levels of the memory cell transistors after erasure, that the writing is carried out with respect to all of the memory cell transistors in the object block of flash erasure before the flash erasure. However, the write-before-erase processing requires extra time.

Also, in the erase processing sequence, it is for the reason of bringing all of the memory cell transistors in the object block of erasure to a perfectly erased state, that the verify processing is carried out after the flash erasure. However, the verify processing must be carried out, one bit by bit, with respect to all of the memory cell transistors, and thus requires a great deal of time.

Thus, the prior art flash memory has required the writing into all of the memory cell transistors in the object block of flash erasure before the flash erasure, and has required the bit-by-bit verify processing after the flash erasure. Accordingly, a problem has been posed in that it is impossible to carry out an erase operation and write operation with high speed.

The preferred embodiments of the present invention will be hereinafter explained with reference to FIGS. 4 to 12. Note, in the description below, the case where the present invention is applied to a flash memory is explained.

Figure 4:
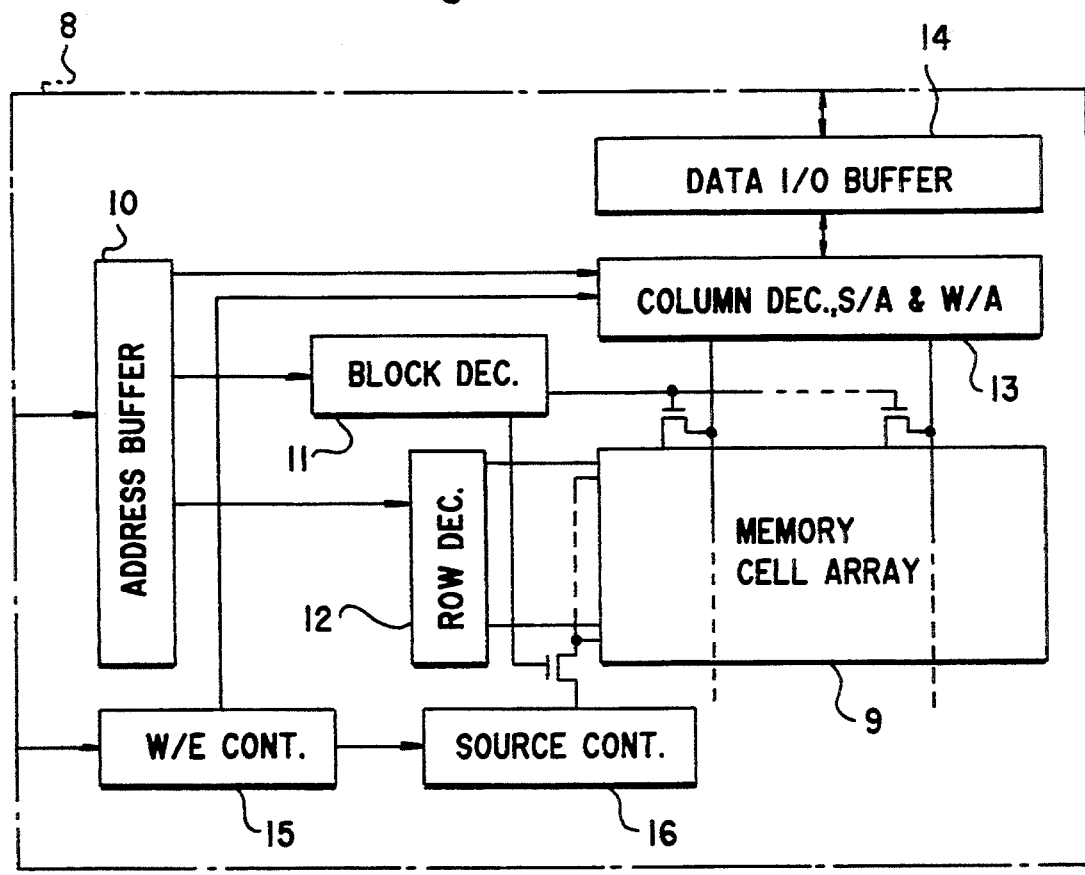
FIG. 4 is a block diagram illustrating the entire constitution of the non-volatile semiconductor memory device according to a first embodiment of the present invention.

FIG. 4 illustrates the entire constitution of the non-volatile semiconductor memory device according to a first embodiment of the present invention.

In the illustration, reference 8 denotes a chip constituting the present device; and reference 9 denotes a regular memory cell array in which a plurality of memory cell transistors (flash memory cell transistors) are arranged in matrix.

Also, reference 10 denotes an address buffer for effecting a buffering of a block address signal, a row address signal and a column address signal, respectively, fed from the outside of the chip 8; and reference 11 denotes a block decoder for decoding an internal block address signal output from the address buffer 10 and thereby selecting a block.

Also, reference 12 denotes a row decoder for decoding an internal row address signal output from the address buffer 10 and thereby selecting a word line; and reference 13 denotes a circuit including a column decoder for decoding an internal column address signal output from the address buffer 10 and thereby selecting a column line, a sense amplifier (S/A) used in a read operation, and a write amplifier (W/A) used in a write operation.

Also, reference 14 denotes a data input/output (I/O) buffer for effecting a buffering of read data and write data; reference 15 denotes a write/erase (W/E) control circuit for controlling a writing and erasure of data; and reference 16 denotes a source control circuit for controlling electrical states of respective sources of each memory cell transistor.

Figure 5:
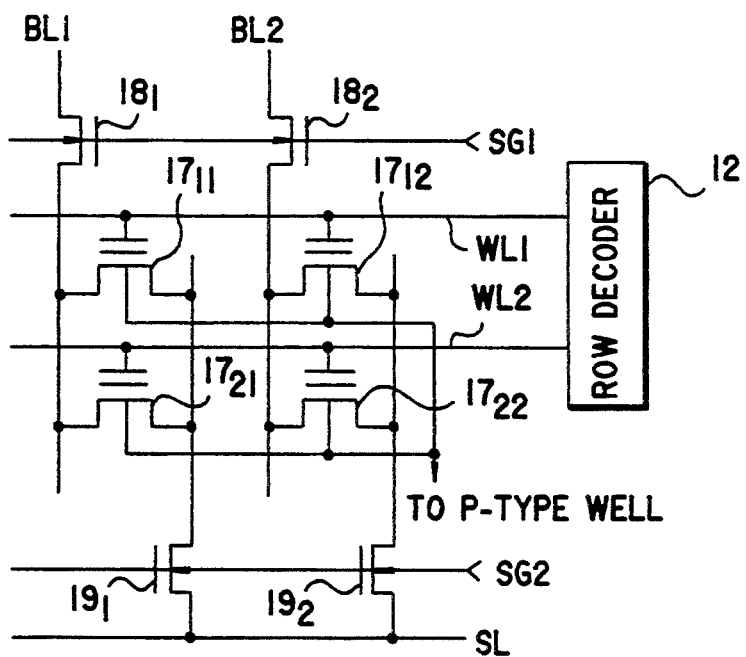
FIG. 5 is a circuit diagram illustrating the constitution of a minimal block portion in the memory cell array shown in FIG. 4.

FIG. 5 illustrates the circuit constitution of a minimal block portion in the memory cell array 9 shown in FIG. 4.

In the illustration, references $17_{11}$ to $17_{22}$ denote memory cell transistors, each formed in a P-type well (see FIG. 1); references WL1 and WL2 denote word lines; references BL1 and BL2 denote bit lines; references $18_1$ and $18_2$ denote N-channel MOS transistors, each constituting a select gate; reference SG1 denotes a select signal for controlling ON/OFF of the transistors $18_1$ and $18_2$; reference SL denotes a common source line for the memory cell transistors $17_{11}$ to $17_{22}$; references $19_1$ and $19_2$ denote N-channel MOS transistors, each constituting a select gate; and reference SG2 denotes a select signal for controlling ON/OFF of the transistors $19_1$ and $19_2$.

FIG. 6 shows the relationship between potentials of each signal line in the circuit shown in FIG. 5. Namely, it shows voltages applied to the word lines WL1, WL2, the select signal SG1, the bit lines BL1, BL2, the select signal SG2, the common source line SL, and the P-type well, when the circuit block shown in FIG. 5 is selected, or not selected, in the cases where a channel erasure, source erasure, writing, and verify after writing, are carried out.

Note, when the circuit block of FIG. 5 is selected in the case where the writing is carried out, it is assumed that "1" is written into the memory cell transistor $17_{11}$, and that "0" is written into the memory cell transistor $17_{12}$.

In other words, the device according to the first embodiment is constituted such that the voltages shown in FIG. 6 are applied to the word lines WL1, WL2, the select signal SG1, the bit lines BL1, BL2, the select signal SG2, the common source line SL, and the P-type well, respectively, to thereby carry out the channel erasure, the source erasure, the writing, and the verify after writing.

For example, when the circuit block of FIG. 5 is selected in the case where the source erasure is carried out, the potentials of the word lines WL1 and WL2 are set to be $-10$ V, respectively. Also, the potential of the select signal SG1 is set to be 0 V, and thus the transistors $18_1$ and $18_2$ are turned OFF. As a result, each drain of the memory cell transistors $17_{11}$ to $17_{22}$ is brought to an open state. Also, the potential of the select signal SG2 is set to be 5 V, and thus the transistors $19_1$ and $19_2$ are turned ON and the potential of the common source line SL is set to be 5 V. As a result, each source of the memory cell transistors $17_{11}$ to $17_{22}$ is set to be 5 V. Note, in this case, the potential of the P-type well is set to be 0 V.

Figure 7:
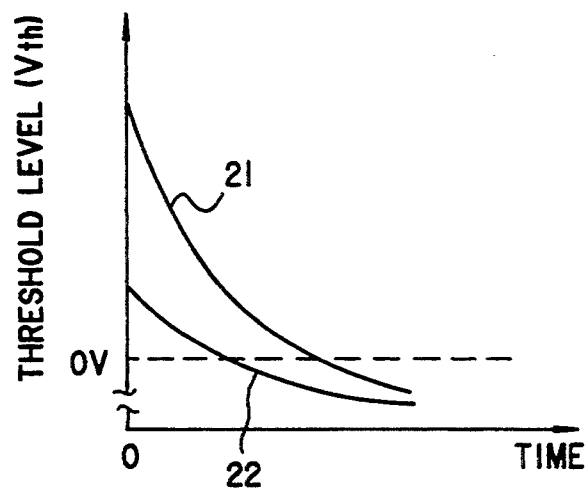
FIG. 7 is a graph showing a change of the threshold level relative to time in the erase operation.

When the above state is continued, e.g., over one second, respective threshold levels (Vth) of the memory cell transistors $17_{11}$ to $17_{22}$ are changed as shown in FIG. 7. The threshold levels are finally lowered to below 0 V, based on overerasure.

Referring to FIG. 7, a curve indicated by reference 21 is obtained in the case where "0" data has been written into a memory cell transistor before erasure, and thus the threshold level of the memory cell transistor has been set to be relatively high. Also, a curve indicated by reference 22 is obtained in the case where "1" data has been written into a memory cell transistor before erasure, and thus the threshold level of the memory cell transistor has been set to be relatively low.

As shown in FIG. 7, by effecting the overerasure, it is possible to reduce the difference between the threshold level after erasure, of the memory cell transistor into which "0" data has been written before erasure, and the threshold level after erasure, of the memory cell transistor into which "1" data has been written before erasure.

The above overerasure also applies to the case where the channel erasure is carried out. In this case (see FIG. 6), the potentials of the word lines WL1 and WL2 are set to be $-10$ V, respectively. Also, the potentials of the select signals SG1 and SG2 are set to be 0 V, respectively, and thus each drain and each source of the memory cell transistors $17_{11}$ to $17_{22}$ are brought to an open state. Also, the potential of the P-type well is set to be 5 V.

On the other hand, when the circuit block of FIG. 5 is not selected in the case where the source erasure is carried out, the potentials of the word lines WL1 and WL2 are set to be 0 V, respectively. Also, the potentials of the select signals SG1 and SG2 are set to be 0 V, respectively, and thus the transistors $18_1$, $18_2$, $19_1$ and $19_2$ are turned OFF. As a result, each drain and each source of the memory cell transistors $17_{11}$ to $17_{22}$ are brought to an open state.

Also, when the circuit block of FIG. 5 is not selected in the case where the channel erasure is carried out, the potentials of the word lines WL1 and WL2 are set to be 0 to 5 V, respectively. Also, the potentials of the select signals SG1 and SG2 are set to be 0 V, respectively, and thus the transistors $18_1$, $18_2$, $19_1$ and $19_2$ are turned OFF. As a result, each drain and each source of the memory cell transistors $17_{11}$ to $17_{22}$ are brought to an open state.

Also, when the word line WL1 is selected and the word line WL2 is not selected in the case where the writing is carried out after the overerasure based on the flash erasure, the potential of the word line WL1 is set to be 20 V and the potential of the word line WL2 is set to be 0 to 10 V. In this case, it is assumed that "1" is written into the memory cell transistor $17_{11}$, and that "0" is written into the memory cell transistor $17_{12}$. Also, the potential of the select signal SG1 is set to be 5 V, and thus the transistors $18_1$ and $18_2$ are turned ON. Furthermore, the potentials of the bit lines BL1 and BL2 are set to be 5 V and 0 V, respectively, and thus the potentials of each drain of the memory cell transistors $17_{11}$ and $17_{12}$ are brought to 5 V and 0 V, respectively. On the other hand, the potential of the select signal SG2 is set to be 0 V, and thus the transistors $19_1$ and $19_2$ are turned OFF. As a result, each source of the memory cell transistors $17_{11}$ and $17_{12}$ is brought to an open state. Also, the potential of the P-type well is set to be 0 V.

In the memory cell transistor $17_{11}$, electrons based on the tunnel current are injected from the drain region into the floating gate. In this case, since the potential difference between the floating gate and the drain is 15 V and thus is relatively small, the threshold level (Vth) of the memory cell transistor $17_{11}$ is changed, as shown by a curve indicated by reference 23 in FIG. 8.

Also, in the memory cell transistor $17_{12}$, electrons based on the tunnel current are injected from the drain region into the floating gate. In this case, since the potential difference between the floating gate and the drain is 20 V and thus is relatively large, the threshold level (Vth) of the memory cell transistor $17_{11}$ is changed, as shown by a curve indicated by reference 24 in FIG. 8.

Figure 8:
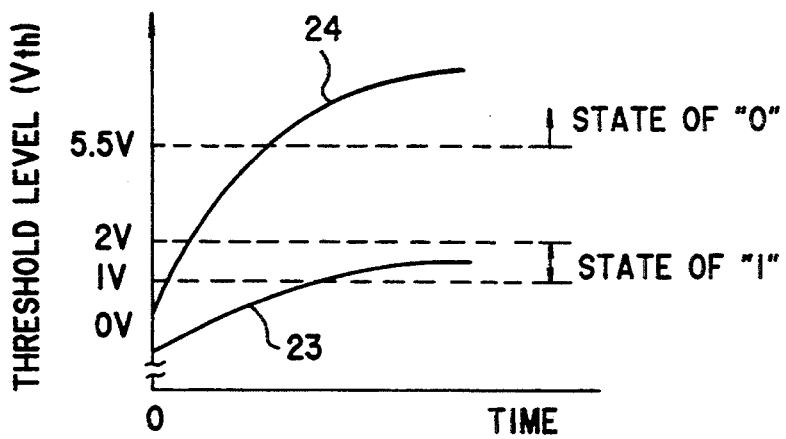
FIG. 8 is a graph showing a change of the threshold level relative to time in the write operation.

Note, when current flowing through the bit line BL1 is lowered to below 50 nA to 6 μA in the case where the potential of the word line WL1 is set to be 1 V and the verify is carried out every 500 μsec to 60 msec (i.e., when the threshold level is settled to 1 to 2 V as shown in FIG. 8), the writing is completed (i.e., the write operation is finished).

Thus, the threshold level of the memory cell transistor $17_{11}$ is settled to the state in which "1" is sufficiently written into the memory cell transistor $17_{11}$, and the threshold level of the memory cell transistor $17_{12}$ is settled to the state in which "0" is sufficiently written into the memory cell transistor $17_{12}$. At this time, the threshold level of the memory cell transistor $17_{12}$ is raised up to above 5.5 V. Accordingly, with respect to the memory cell transistor $17_{12}$ into which "0" is to be written, it becomes unnecessary to carry out the verify after writing. Namely, only with respect to the memory cell transistor $17_{11}$ into which "1" is to be written, one has only to carry out the verify after writing.

Figure 9:
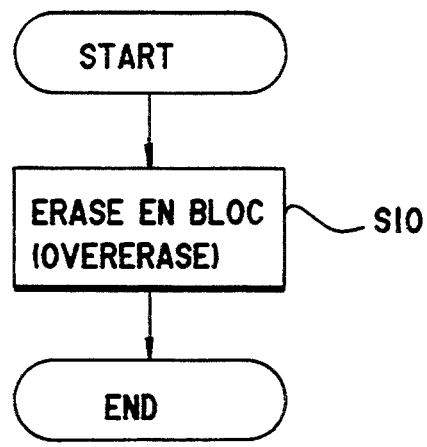
FIG. 9 is a flowchart representing the sequence of an erase processing executed in the first embodiment.
Figure 10:
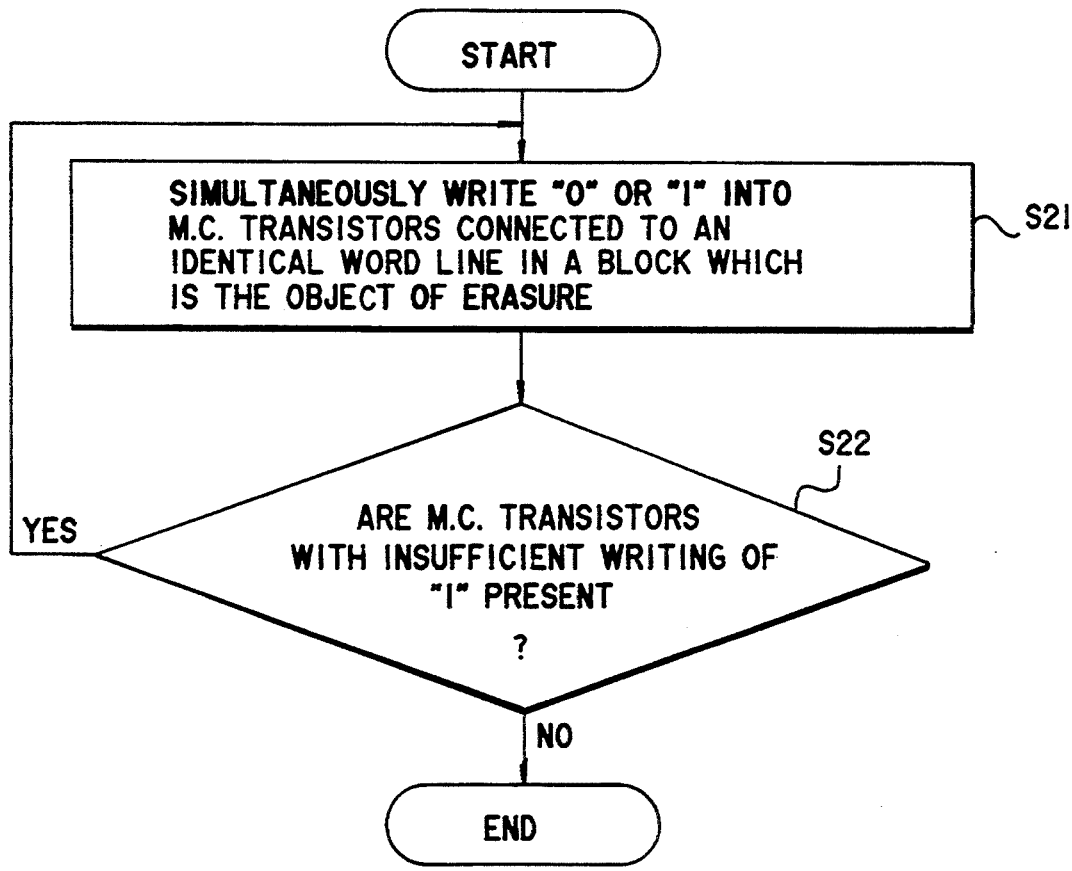
FIG. 10 is a flowchart representing the sequence of a write processing executed in the first embodiment.

Therefore, according to the first embodiment, a writing can be carried out by executing an erase processing sequence shown in FIG. 9 and executing a write processing sequence shown in FIG. 10.

Referring to FIG. 9, a flash erasure is carried out with respect to all of memory cell transistors included in a block which is an object of erasure (e.g., the circuit block shown in FIG. 5), and thus all of the memory cell transistors are brought to an overerased state ("ERASE EN BLOC (OVERERASE)" processing at step S10).

Next, referring to FIG. 10, a writing of "0" or "1" is carried out simultaneously, with units of a plurality of memory cell transistors connected to an identical word line in the object block of erasure (see step S21). At the next step S22, a judgment whether memory cell transistors with insufficient writing of "1" are present (YES) or not (NO) is carried out. Where the judgment indicates YES, the control returns to step S21, and where the judgment indicates NO, the control comes to an END. Namely, the writing is repeated while the verify operation is carried out only with respect to memory cell transistors into which "1" is written.

Thus, according to the first embodiment, it is not necessary to carry out a writing with respect to the memory cell transistors in the object block of flash erasure before the flash erasure, and to carry out a bit-by-bit verify processing after the flash erasure.

Also, after the flash erasure, the writing is carried out simultaneously, with units of a predetermined plurality of memory cell transistors. Furthermore, only with respect to memory cell transistors of which each threshold level should be selected to be low (in the example, the memory cell transistor $17_{11}$ into which "1" is to be written), one has only to carry out the verify processing.

Therefore, according to the first embodiment, it is possible to realize the erase and write operation with a higher speed than in the prior art flash memory.

Figure 11:
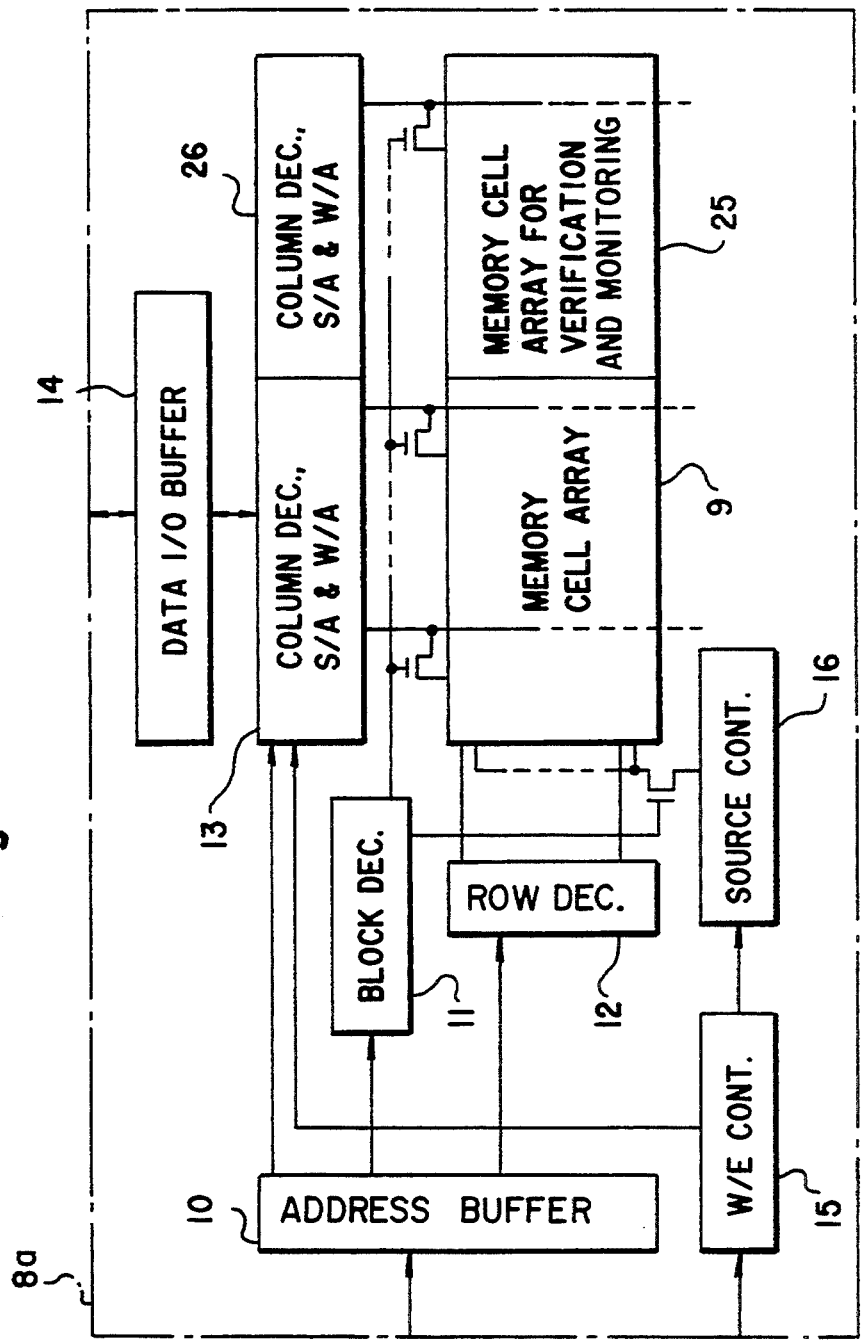
FIG. 11 is a block diagram illustrating the entire constitution of the non-volatile semiconductor memory device according to a second embodiment of the present invention.

FIG. 11 illustrates the entire constitution of the non-volatile semiconductor memory device according to a second embodiment of the present invention.

Compared with the first embodiment of FIG. 4, the device according to the present embodiment further includes a verify/monitor memory cell array 25 provided for verification and monitoring of the regular memory cell transistors included in the memory cell array 9, and a circuit 26 with a function equivalent to that of the circuit 13 (column decoder, sense amplifier (S/A), and write amplifier (W/A)).

Figure 12:
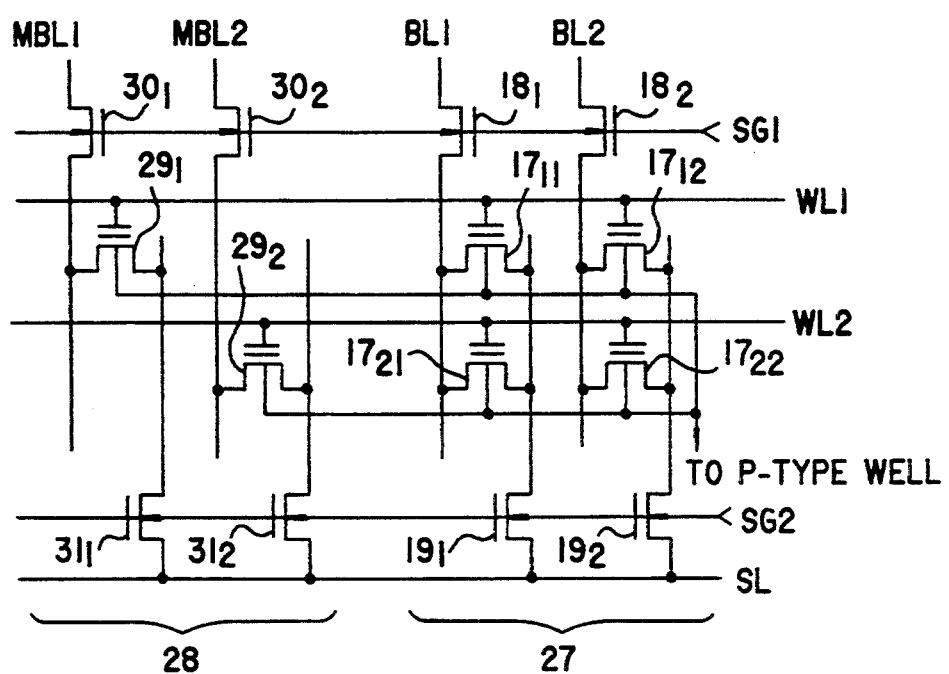
FIG. 12 is a circuit diagram illustrating the constitution of a minimal block portion in the regular memory cell array and a portion in the verify/monitor memory cell array shown in FIG. 11.

FIG. 12 illustrates the circuit constitution of a minimal block portion in the regular memory cell array 9 and a portion in the verify/monitor memory cell array 25 shown in FIG. 11.

In the illustration, reference 27 denotes a predetermined minimal block portion in the memory cell array 9, and reference 28 denotes a corresponding portion in the verify/monitor memory cell array 25, provided for the block portion 27.

Also, references $29_1$ denotes a verify/monitor memory cell transistor provided for the regular memory cell transistors $17_{11}$ and $17_{12}$, and references $29_2$ denotes a verify/monitor memory cell transistor provided for the regular memory cell transistors $17_{21}$ and $17_{22}$. Note, the verify/monitor memory cell transistors $29_1$ and $29_2$ are formed in a P-type well (see FIG. 1) in the same manner as the memory cell transistors $17_{11}$ to $17_{22}$.

Also, references MBL1 and MBL2 denote verify/monitor bit lines, and references $30_1$, $30_2$, $31_1$ and $31_2$ denote N-channel MOS transistors, each constituting a verify/monitor select gate.

In the above constitution, when the word line WL1 is selected in the case where a writing is carried out, the potential of the word line WL1 is set to be 20 V and the potential of the word line WL2 is set to be 0 to 10 V. Accordingly, by setting the potential of the bit line MBL1 to be 5 V and setting the potential of the bit line MBL2 to be 0 to 5 V, it is possible to write "1" into the verify/monitor memory cell transistor $29_1$.

In the same manner, when the word line WL2 is selected, the potential of the word line WL1 is set to be 0 to 10 V and the potential of the word line WL2 is set to be 20 V. In this case, by setting the potential of the bit line MBL1 to be 0 to 5 V and setting the potential of the bit line MBL2 to be 5 V, it is possible to write "1" into the verify/monitor memory cell transistor $29_2$.

According to the second embodiment, the verify after writing can be carried out using the verify/monitor memory cell transistors $29_1$ and $29_2$. In other words, with respect to the regular memory cell transistors $17_{11}$ to $17_{22}$, it becomes unnecessary to carry out the verify after writing.

Therefore, according to the second embodiment, it is possible to realize the erase and write operation with a higher speed than in the first embodiment.

Also, where verify/monitor memory cell transistors are not provided, a problem may occur in that, in a verify operation, a large amount of current flow into memory cell transistors in an overerased state connected to a selected bit line, and thus it is impossible to satisfactorily carry out the verify operation. According to the second embodiment, however, it is possible to perfectly remove the problem. This is because each of the verify/monitor memory cell transistors $29_1$, $29_2$ is provided to have its own bit line MBL1, MBL2, independently of the regular bit lines BL1 and BL2.

Although, in the above embodiments, the writing into memory cell transistors is carried out by injecting electrons based on the tunnel current from the drain region into the floating gate, it is not restrictive. For example, the writing may be carried out by injecting electrons based on the tunnel current from the source region into the floating gate, from the drain and source regions into the floating gate, or from the well region into the floating gate, or may be carried out by injecting electrons generated based on an avalanche breakdown phenomenon in the vicinity of the drain region, into the floating gate.

Although the present invention has been disclosed and described by way of two embodiments, it is apparent to those skilled in the art that other embodiments and modifications of the present invention are possible without departing from the spirit or essential features thereof.

I claim:

1. A non-volatile semiconductor memory device wherein each transistor having a two-layer gate structure with a control gate and a floating gate is constituted as a memory cell transistor, the non-volatile semiconductor memory device comprising:

a control circuit provided for controlling erasure and writing of data with respect to memory cell transistors, the control circuit generating, in an erase operation, a voltage required for bringing memory cell transistors to an overerased state, and in a write operation, the control circuit applying an identical voltage to each control gate of a plurality of memory cell transistors connected to an identical word line, and generating a first voltage required for releasing memory cell transistors in an overerased state from the overerased state to thereby cause the memory cell transistors to retain data corresponding to a first logic level, and a second voltage required for releasing memory cell transistors in an overerased state from the overerased state to thereby cause the memory cell transistors to retain data corresponding to a second logic level, one of said generated first voltage and second voltage being supplied to a bit line corresponding to each of the memory cell transistors, the control circuit bringing all of memory cell transistors included in an object block portion of erasure, to an overerased state, by means of a flash erasure, wherein the control circuit controls a write operation with units of a plurality of memory cell transistors in an overerased state connected to an identical word line, the write operation including a first writing into memory cell transistors which should be released from the overerased state to thereby retain data corresponding to the first logic level, and a second writing into memory cell transistors which should be released from the overerased state to thereby retain data corresponding to the second logic level.

2. The non-volatile semiconductor memory device as set forth in claim 1, wherein the control circuit controls the first writing and the second writing to be simultaneously carried out.

3. A non-volatile semiconductor memory device wherein each transistor having a two-layer gate structure with a control gate and a floating gate is constituted as a memory cell transistor, the non-volatile semiconductor memory device comprising:

a control circuit provided for controlling erasure and writing of data with respect to memory cell transistors, the control circuit generating, in an erase operation, a voltage required for bringing memory cell transistors to an overerased state, and in a write operation, the control circuit applying an identical voltage to each control gate of a plurality of memory cell transistors connected to an identical word line, and generating a first voltage required for releasing memory cell transistors in an overerased state from the overerased state to thereby cause the memory cell transistors to retain data corresponding to a first logic level, and a second voltage required for releasing memory cell transistors in an overerased state from the overerased state to thereby cause the memory cell transistors to retain data corresponding to a second logic level, one of skid generated first voltage and second voltage being supplied to a bit line corresponding to each of the memory cell transistors; and a verify/monitor circuit block including a verify/monitor memory cell transistor connected to each of a plurality of word lines included in an object block portion of flash erasure, the control circuit reading data of each verify/monitor memory cell transistor to which overerasure of writing is carried out simultaneously with regular memory cell transistors included in said object block portion, and thus judging respective states of erasure or writing of the regular memory cell transistors.

4. The non-volatile semiconductor memory device as set forth in claim 3, wherein the verify/monitor circuit block is provided in a region adjacent to the object block portion.

5. The non-volatile semiconductor memory device as set forth in claim 4, wherein each verify/monitor memory cell transistor is provided for regular memory cell transistors connected to an identical word line included in said object block portion, and is provided to have an individual bit line.

6. A method of writing data in a non-volatile semiconductor memory device wherein each transistor having a two-layer gate structure with a control gate and a floating gate is constituted as a memory cell transistor, the method comprising the steps of:

executing a flash erasure with respect to all of memory cell transistors included in an object block portion of erasure, to thereby bring all of the memory cell transistors to an overerased state;

simultaneously writing "0" data or "1" data, with units of a plurality of memory cell transistors connected to an identical word line in the object block of erasure; and judging whether or not memory cell transistors with insufficient writing of "1" data are present among the plurality of memory cell transistors, and where the judging indicates YES, executing the step of simultaneously writing "0" data or "1" data.

* * * * *